United States Patent
Natarajan et al.

(10) Patent No.: US 7,002,369 B2
(45) Date of Patent: Feb. 21, 2006

(54) IMPLEMENTING COMPLEX CLOCK DESIGNS IN FIELD PROGRAMMABLE DEVICES

(75) Inventors: Venkatesh Natarajan, Bangalore (IN); Ameet Suresh Bagwe, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 35 days.

(21) Appl. No.: 10/709,237

(22) Filed: Apr. 23, 2004

(65) Prior Publication Data

US 2004/0212397 A1 Oct. 28, 2004

Related U.S. Application Data

(60) Provisional application No. 60/465,928, filed on Apr. 25, 2003.

(51) Int. Cl.
  *G06F 7/38* (2006.01)
  *H03K 19/177* (2006.01)
(52) U.S. Cl. .......................... 326/39; 326/40
(58) Field of Classification Search ................ 341/101, 341/100, 50–53; 326/38, 39, 46, 47, 37
See application file for complete search history.

(56) References Cited

U.S. PATENT DOCUMENTS

| | | | |
|---|---|---|---|
| 5,811,987 A * | 9/1998 | Ashmore et al. | 326/39 |
| 6,138,266 A | 10/2000 | Ganesan et al. | |
| 6,229,337 B1 * | 5/2001 | Xiao et al. | 326/41 |
| 6,487,648 B1 * | 11/2002 | Hassoun | 711/167 |
| 6,691,287 B1 | 2/2004 | Ganesan et al. | |
| 6,724,328 B1 * | 4/2004 | Lui et al. | 341/101 |
| 6,734,703 B1 * | 5/2004 | Alfke et al. | 326/38 |

* cited by examiner

*Primary Examiner*—John B Nguyen
(74) *Attorney, Agent, or Firm*—Robert D. Marshall, Jr.; W. James Brady, III; Frederick J. Telecky, Jr.

(57) ABSTRACT

An aspect of the present invention simplifies the implementation of complex clock designs in field programmable devices (FPD). To implement a circuit logic containing base sequential elements (e.g., D flip-flops) with corresponding circuit clocks, a number of modified sequential elements equaling the number of base sequential elements may be employed. Each modified sequential element (contained in FPD) receives a global clock, corresponding circuit clock and a data value. A base sequential element (contained in modified sequential element) transitions to a next state only after occurrence of a transition on a corresponding circuit clock and the transition to said next state may be timed according to the global clock. By timing the transitions according to the global clock, several undesired results may be avoided.

9 Claims, 4 Drawing Sheets

IMPLEMENTING COMPLEX CLOCK DESIGNS IN FIELD PROGRAMMABLE DEVICES

CROSS REFERENCE TO RELATED APPLICATIONS

The present application is related to and claims priority from now abandoned U.S. provisional patent application entitled, "A Method for Easy FPGA Implementation of Designs with Complex Clockings", Filed: Apr. 25, 2003, Ser. No. 60/465,928, naming as inventors: NATARAJAN et al, and is incorporated in its entirety herewith into the present application.

BACKGROUND OF INVENTION

1. Field of the Invention

The present invention relates to field programmable devices, and more specifically to a method and apparatus for implementing complex clock designs in such devices.

2. Related Art

Field programmable devices (FPD) generally refer to pre-fabricated logic circuits which can be programmed to implement a circuit logic. A typical FPD contains many cells, which can individually be programmed to one of several pre-specified logic blocks (e.g., a logic gate or a sequential element) and can be interconnected in a desired fashion to implement a desired circuit logic. Examples of FPDs include FPGAs (field programmable gate arrays) and programmable logic devices (PLDs) as is well known in the relevant arts.

FPDs find application in several areas. For example, an entire circuit logic can be implemented using FPDs quickly without having to engage in expensive and time-consuming tasks such as implementing masks for fabrication of individual integrated circuits. As another example, FPDs are used for prototyping circuits to ensure at least some aspects of the proposed circuit logic can be verified.

FPDs generally need to support implementation of complex clocks since such clocks would be required in at least some circuit logics. For example, some or all of derived clocks, divided clocks, gated clocks, independently generated clocks, etc., may be generated and/or used in different parts of a circuit logic.

One typical requirement in having such complex clocks is to ensure that the time delay ('skew') between two clock signals is within a pre-specified value. If the skew is higher than the pre-specified value, various anomalies such as unpredictable results may be caused, as is well known in the relevant arts.

In one prior approach, an FPD (while being manufactured) may be designed to provide a small number of clock buffers which provided limited skew, thereby addressing the problem noted above. However, one problem with such an approach is that a circuit logic may contain several more (number of) clock signals, and accordingly the corresponding solutions may be inadequate.

In view of problems such as above, a designer may spend a substantial amount of time addressing the clock related problems, and accordingly such solutions are not acceptable at least in some environments (e.g., when rapid prototyping is desirable). What is therefore needed is a method and apparatus to implement complex clock designs in FPDs.

BRIEF DESCRIPTION OF DRAWINGS

Various features of the present invention will be described with reference to the following accompanying drawings.

FIG. (FIG.) 1 is a circuit diagram shown containing a portion of a FPGA illustrating the problem caused due to skew associated with circuit clocks in one prior embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, a global clock signal is used to control the time point of transition of sequential elements in a FPD (field programmable device) to a next state. The global clock signal may be connected to the clock inputs of the respective sequential elements. Circuit clocks, which are otherwise intended to control the state transitions (of the sequential elements), are used as enable signals for the sequential elements.

Due to the use of the circuit clocks as enable signals, the sequential elements may undergo the same transitions as compared to an implementation in which the circuit clocks are connected to the respective clock inputs of the sequential elements. As the timing of the transitions is controlled by the global clock, any substantial skew between the circuit clocks may not affect the functional operation of the base sequential elements, thereby overcoming at least some of the problems noted above in the background section.

Thus, a designer may implement complex circuit logic without having an in-depth understanding of the clock-related issues. Such features may also be of interest at least in prototyping situations in which the functional operation of a circuit logic is sought to be verified since a designer may be substantially relieved of several clock timing related issues. Thus, the time required for prototyping may be reduced.

Accordingly, by using various features of the present invention, FPDs may be programmed with a circuit logic, without being affected by potential skew between various circuit clock signals. It is helpful to first understand the problem associated with a prior implementation of FPDs, and accordingly the description is continued with reference to a prior approach which illustrates the problem caused due to skew associated with circuit clocks.

2. Example Prior Approach

Figure 1:
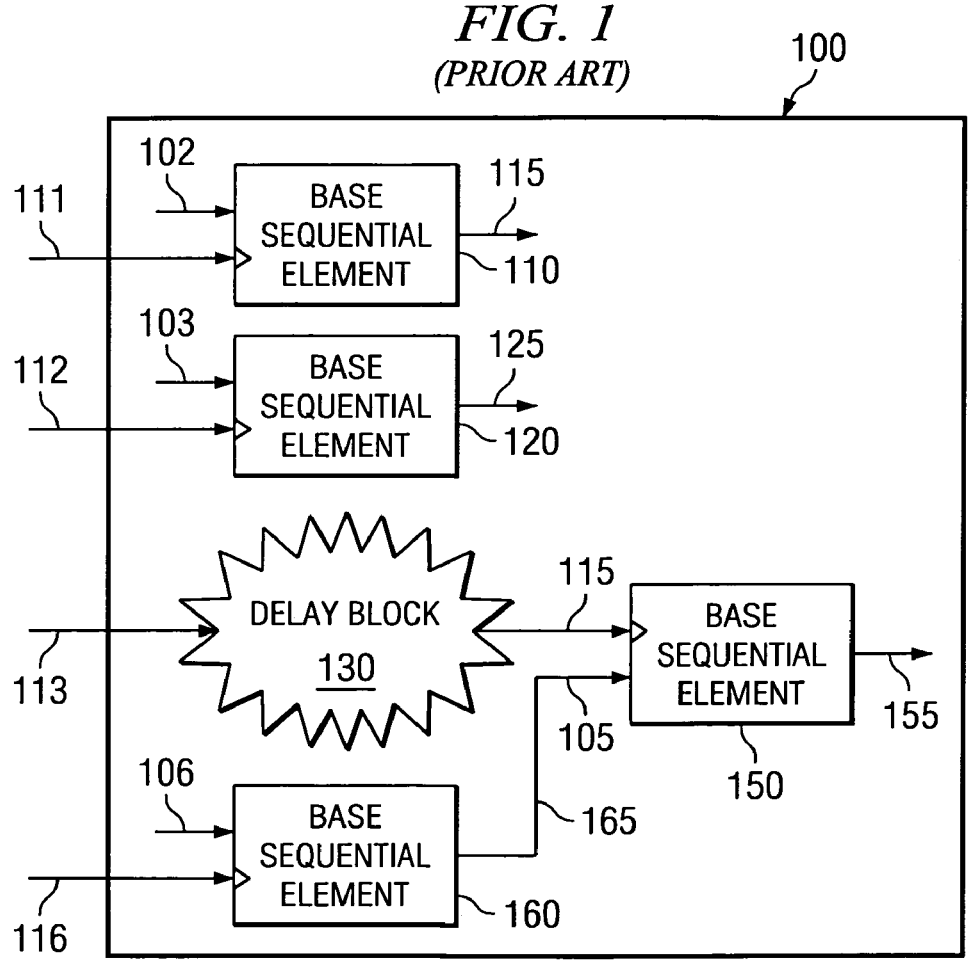

FIG. 1 is a circuit diagram shown containing a portion of FPGA 100 illustrating the problem caused due to skew associated with circuit clocks in one prior embodiment. For simplicity of understanding, FPGA 100 is shown containing only few sequential elements (e.g., D type flip-flops), however, FPGA 100 may contain many other components (sequential elements and combinatorial logic) connected according to a circuit logic. FPGA 100 is shown containing base sequential elements 110, 120, 150 and 160, and delay block 130. Each block is described in detail below.

Base sequential elements 110, 120, 150 and 160 implement a circuit logic when clocked according to the respective circuit clocks 111, 112, 115 and 116 respectively. Assuming that each base sequential element forms a D flip-flop, the data on paths 102, 103, 105, and 106 is provided on corresponding output paths 115, 125, 155 and 165 according to the corresponding circuit clock. It should be understood that the circuit clocks can be generated independently of or from a common system clock.

Delay block 130 delays clock signal 113, and the delayed clock signal is provided as circuit clock 115 to base sequential element 150. Delay block 130 may contain a combinatorial logic to introduce the delay. The delay is assumed to cause a substantial skew of circuit clock 115 in relation to circuit clock 116, and the resulting undesirable results are described below with respect to FIG. 2.

Figure 2:
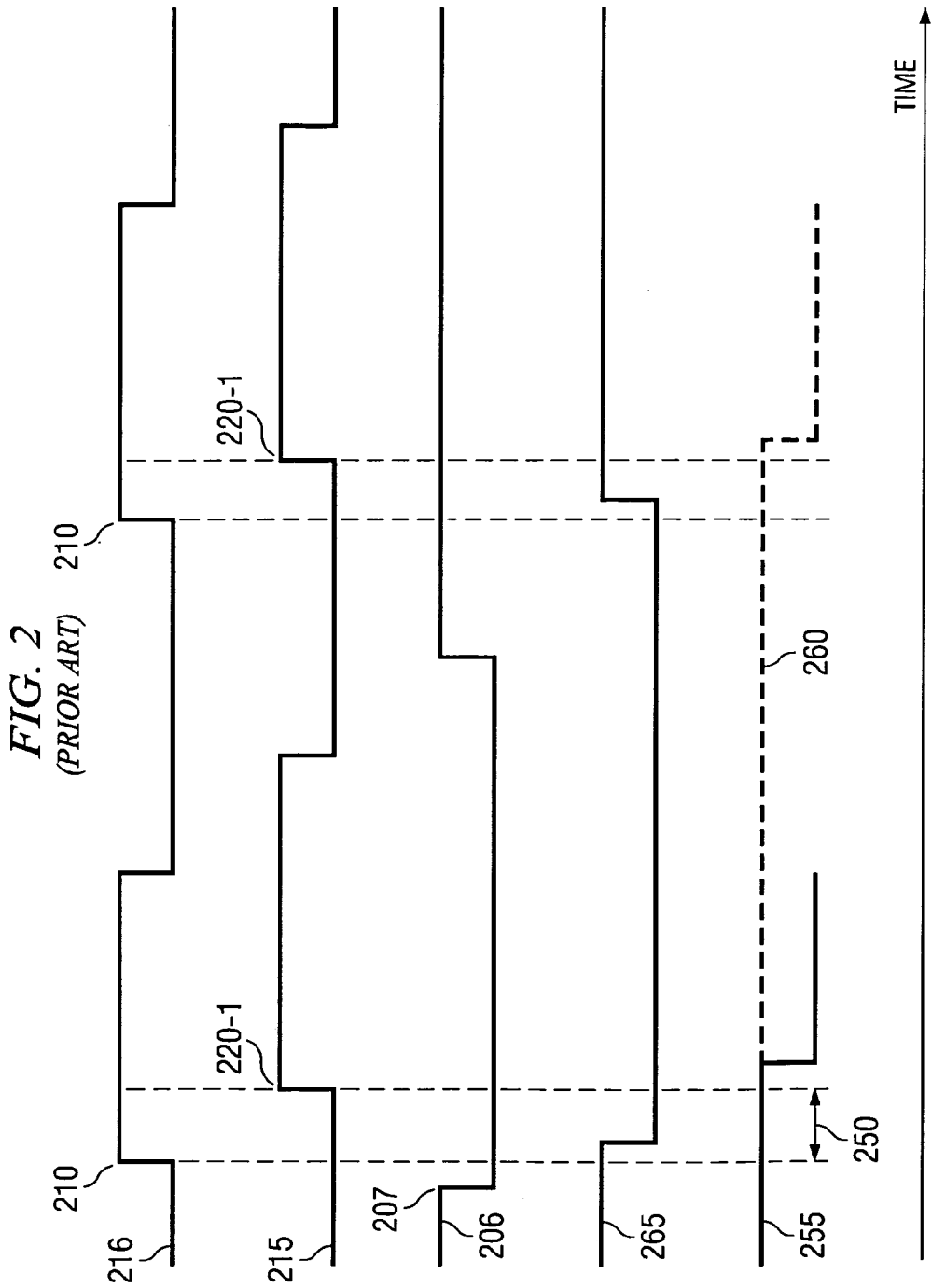
FIG. 2 is a graph depicting the timing diagram illustrating the problem associated with the circuit diagram of FIG. 1.

FIG. 2 is a timing diagram illustrating the manner in which unpredictable results may be caused due to skew associated with circuit clocks. Waveforms 216, 215, 206, 265 and 255 respectively represent circuit clock 116, circuit clock 115, input on path 106, output on path 165 and output on path 155.

Figure 5:
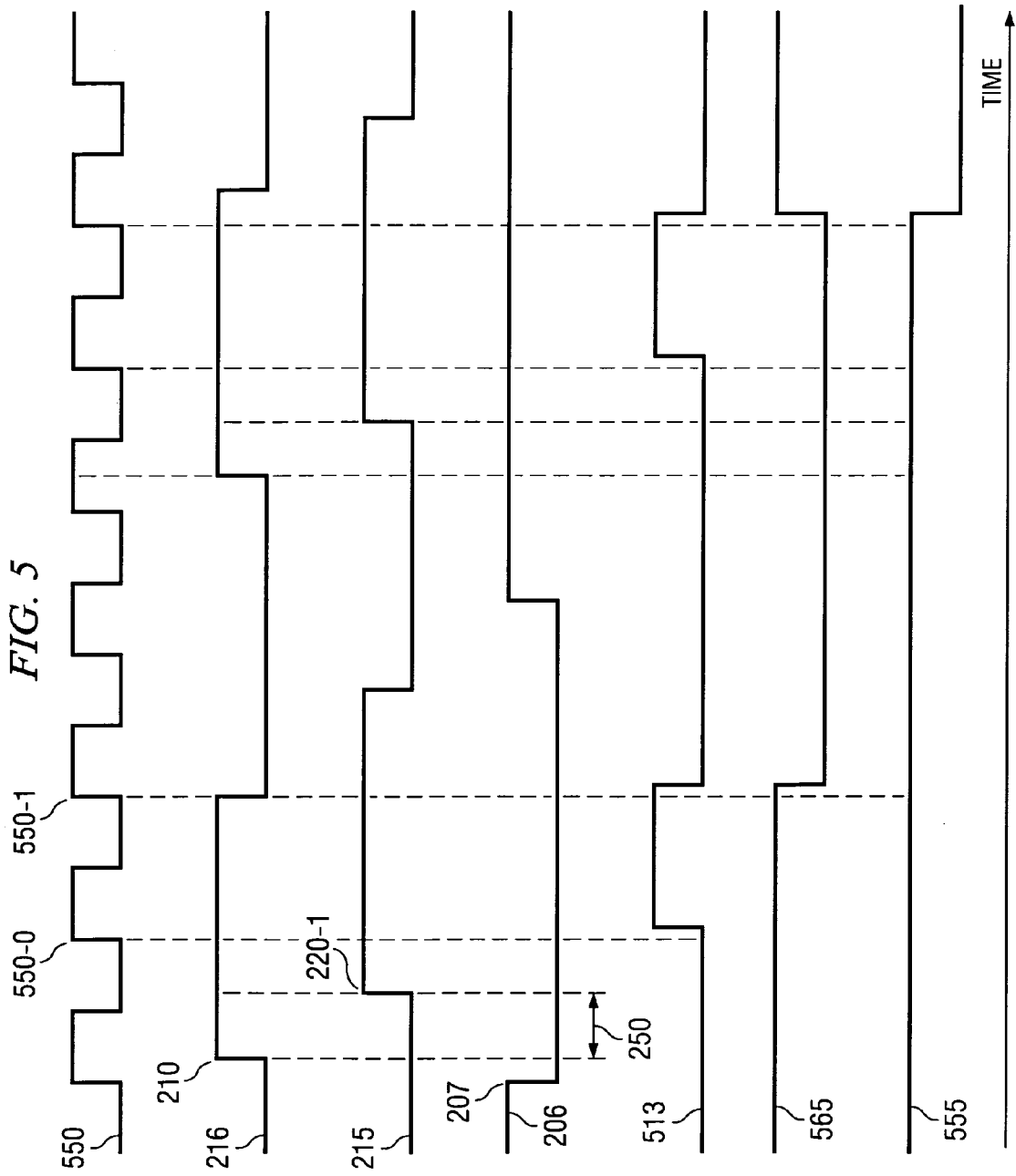
FIG. 5 is a timing diagram illustrating the operation of a FPGA implemented according to an aspect of the present invention.

At time point 220-1 in both this figure and FIG. 5, it appears that 207 needs to be earlier than time point 210. In FIG. 5 this is changed (possibly under the assumption that this time point is for the other input), the data on path 106 is changed from logic high to logic low (0). Before time point 210, data on paths 255 and 265 is shown at logic high (0). At time point 210, circuit clock 216 is shown going from 0 to 1, and circuit clock 215 is shown following to 1 at time point 220-1 with a skew of duration 250. Skew 250 between circuit clocks 116 and 115 is assumed to be caused by delay block 130. Ideally skew 250 should equal zero.

Assuming that skew 250 is short, dotted portion 260 represents the correct (expected) output on path 155, which represents a scenario in which the data (1) on path 165 in the previous clock cycle is propagated as the output on path 155.

On other hand, if skew 250 is long, the 0 value of waveform 206 is propagated to path 165 (waveform 265) after time point 210 (the rising edge of circuit clock 116), and the propagated data is further propagated to path 155 (waveform 255) after time point 220-1 (the rising edge of circuit clock 115) assuming that the time point 210 is sooner (compared to time point 220-1) by at least the setup time of base sequential element 150.

As may be readily observed, such a result is undesirable. Various aspects of the present invention overcome such a disadvantage even in the presence of complex clocks as described below in further detail.

3. Support for Complex Clocking

Figure 3:
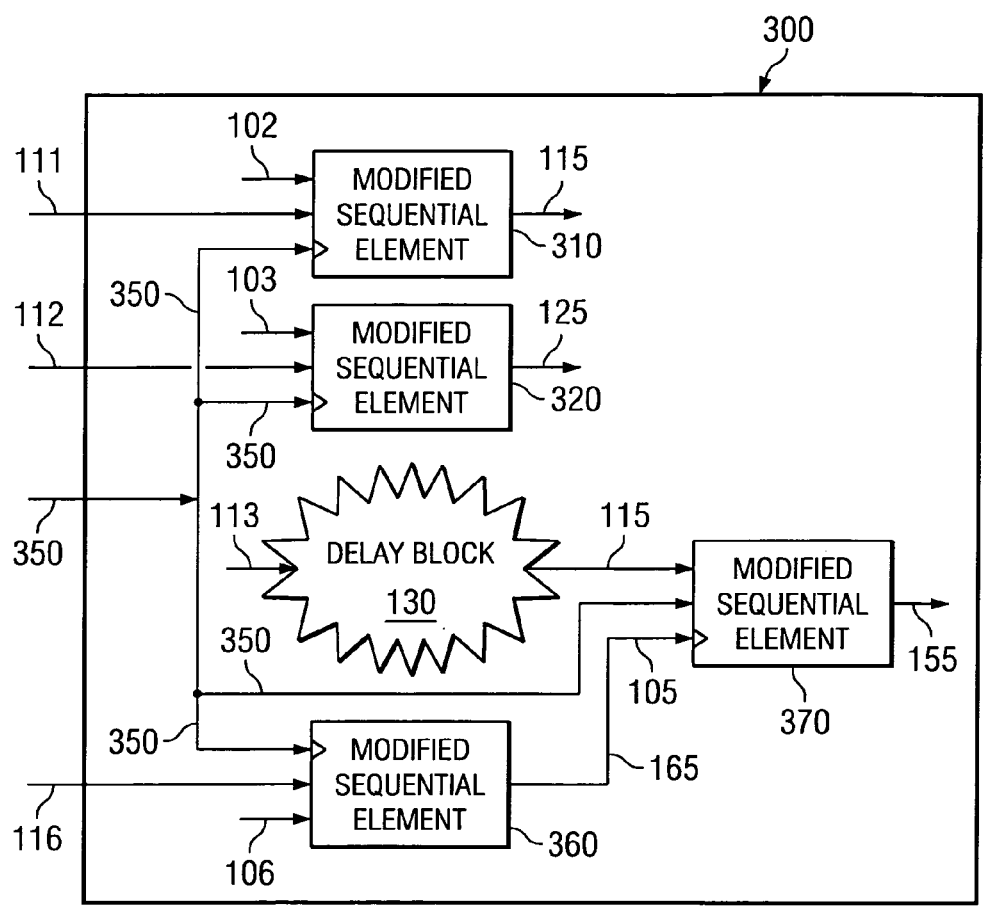
FIG. 3 is a circuit diagram of a FPGA implemented according to an aspect of the present invention.

FIG. 3 is a circuit diagram illustrating the details of FPGA 300 implemented according to an aspect of the present invention. FPGA 300 is shown containing modified sequential elements 310, 320, 360 and 370, and global clock received on path 350. The components of FIG. 3 are described in relation to the corresponding components of FIG. 1 for conciseness.

Each modified sequential element (310, 320, 360, 370) is shown receiving three inputs, with global clock 350 being connected to the clock input of each base sequential element. Each circuit clock (111, 112, 115, and 116) is shown connected to the enable input of the corresponding base sequential element.

Each modified sequential element transitions to a next state only after a (e.g., rising) transition of the corresponding enable input (i.e., the circuit clock). However, the specific time point of transition is controlled by a transition of global clock 350 (due to connection to the clock input). Global clock 350 may be designed to be a higher speed clock (compared to the circuit clocks), thereby ensuring that the transitions occur soon after the transitions on the circuit clocks.

Due to such an implementation, some of the problems due to the skew between various circuit clocks is eliminated/reduced, as described in further detail in sections below. The description is continued with reference to the details of implementation of an example embodiment of modified sequential element 370.

4. Implementation of Modified Sequential Element

Figure 4:
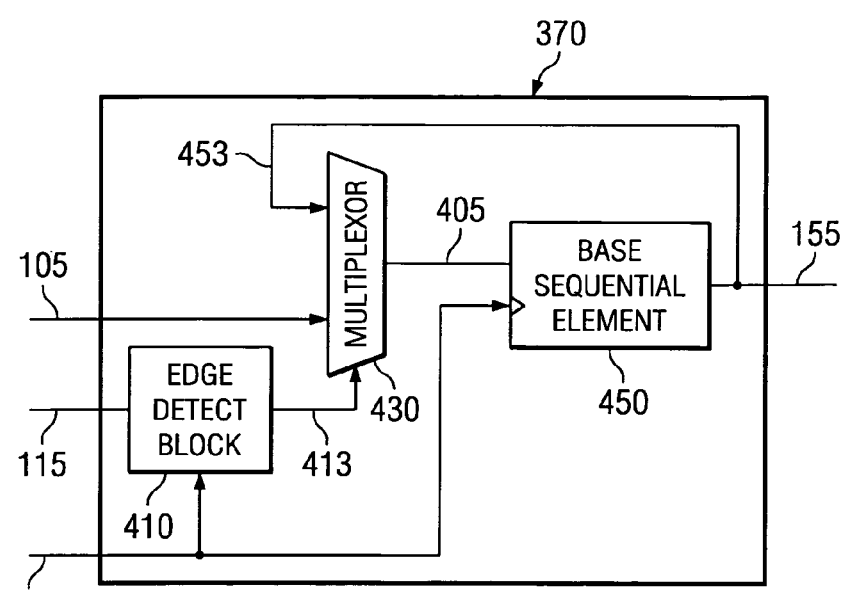
FIG. 4 is a circuit diagram of a modified sequential element implemented according to an aspect of the present invention.

FIG. 4 is a block diagram illustrating the details of a modified sequential element implemented according to an aspect of the present invention. For illustration, only sequential element 370 is described below, however, other sequential elements (310, 320 and 360) may be implemented similarly. Modified sequential element 370 is shown containing edge detect block 410, multiplexor 430, and base sequential element 450. Each block is described in detail below.

Edge detect block 410 generates an enable pulse (on path 413) for one clock cycle of global clock 350 on receiving a rising edge of circuit clock 115. The enable pulse is provided as select control signal 413 to multiplexor 430. The implementation of edge detect block 410 will be apparent to one skilled in the relevant arts by reading the disclosure provided herein. Base sequential element 450 may operate similar to base sequential elements 110/120/150 and 160, and thus store a value received on path 405 at an (rising) edge of global clock 350.

Multiplexor 430 selects one of the inputs received on paths 105 and 453 as output on path 405 according to the logic level received on select control signal 413. Thus, the data on path 105 is selected when (in the clock cycle) a pulse (generated by edge detect block 410) is received on select control signal 413, and the data on path 453 is selected otherwise. As global clock 350 operates at a high frequency, the output available on path 155 is fed back as input to base sequential element 450.

As a result, the data available on path 105 is transferred only after the rising edge of circuit clock 105, but the time of transfer is controlled by clock 350. The description is continued with reference to a timing diagram illustrating the operation of the circuits of FIGS. 3 and 4 in further detail.

5. Timing Diagram

FIG. 5 is a timing diagram illustrating the manner in which the problem(s) associated with FIGS. 1 and 2 may be addressed by the circuits of FIGS. 3 and 4. For conciseness, only the differences of FIG. 5 as compared to FIG. 2 are described for conciseness. In addition to the signals of FIG. 2, the timing diagram of FIG. 5 is shown depicting clock 550 (corresponding to global clock 350), select control signal 513 (path 413), output 565 (path 165 of FIG. 4), and output 555 (path 155 of FIG. 4). Each waveform is described in detail below.

Select control signal 513 is shown rising from logic low to logic high soon after receiving the rising edge of global clock 350 after receiving active edge (at time point 220-1) of circuit clock 115. As shown, circuit clock 115 is shown going high at time point 220-1, and select control 513 is shown rising after time point 550-0 thereafter. The enable signal stays at logic high for one clock duration of global clock 350, as shown.

Unlike in FIG. 2, due to the use of the modified sequential elements, the transfer of data is postponed to time point 550-1 (the rising edge of global clock 350). As both the modified sequential elements 360 and 370 transfer the corresponding data elements at substantially the same time, the problems of FIG. 2 are avoided.

It should be understood that the approaches of above can be integrated into several environments, while taking into consideration various considerations. Some example considerations are described below.

6. Implementation Considerations

As may be observed, the frequency of global clock 350 is higher than the frequency of other circuit clocks (115 and 116). The frequency of global clock 350 may be chosen taking into account the maximum permissible skew among the different circuit clocks. In general, the clock duration of global clock 350 needs to be more than the maximum skew between all circuit clocks.

Even though modified sequential element of FIG. 3 is shown containing an edge detect block (which typically contains an additional sequential element), it should be understood that the edge detector circuit may be shared by many modified sequential elements. In general, the same edge detector circuit may be shared by all the sequential elements in the same cluster domain (which need to receive the clock signal at the same time). As a result, various aspects of the present invention can be implemented without substantially more number of sequential elements.

The global clock may be provided on a low skew path such that the transitions are available to all modified sequential elements at substantially the same time. However, due to the use of various features of the present invention, the circuit clocks may be provided on high skew paths. As a result, a circuit logic may be implemented on a FPD that support only a limited number of (or even one single) low skew clock networks.

In addition, it may be appreciated that the circuit clocks may need to be either derived from or synchronized with the global clock signal.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A field programmable device (FPD) implementing a circuit logic containing a first base sequential element to be clocked by a first circuit clock and a second base sequential element to be clocked by a second circuit clock, said FPD comprises:

a first modified sequential element to receive a global clock and said first circuit clock, said first modified sequential element containing said first base sequential element, said global clock being connected to a clock input of said first base sequential element, said first base sequential element transitioning to a next state only after occurrence of a transition on said first circuit clock and transition to said next state being timed according to said global clock; and a second modified sequential element to receive said global clock and said second circuit clock, said second modified sequential element containing said second base sequential element, said global clock being connected to a clock input of said second base sequential element, said second base sequential element transitioning to a next state only after occurrence of a transition on said second circuit clock and transition to said next state being timed according to said global clock.

2. The FPD of claim 1, wherein timing the transitions of said first base sequential element and said second base sequential element according to said global clock avoids problems due to any substantial skew present between said first circuit clock and said second circuit clock.

3. The FPD of claim 2, wherein the clock period of said global clock is more than the maximum skew between said first circuit clock and said second circuit clock.

4. The FPD of claim 2, wherein said FPD is used to validate a logic design of said circuit logic.

5. The FPD of claim 1, wherein said first modified sequential element further comprises:

a first multiplexor selecting an output of said first base sequential element if a select input to said first multiplexor is at a first logic level, and selecting a data input if said select input is at a second logic level, wherein said data input is designed to be an input to said first base sequential element according to said circuit logic, said multiplexor providing said output as an input to said first base sequential element; and a detect block generating said select input such that said select input changes from said first logic level to said second logic level after occurrence of a transition on said first circuit clock.

6. The FPD of claim 5, wherein said detect block is shared by said first modified sequential element and said second modified sequential element.

7. The FPD of claim 1, wherein said FPD comprises a FPGA.

8. An apparatus implementing a circuit logic in a field programmable device (FPD), said circuit logic containing a first base sequential element to be clocked by a first circuit clock and a second base sequential element to be clocked by a second circuit clock, said apparatus comprising:

means for transitioning said first base sequential element to a next state after the occurrence of a transition on said first circuit clock, transition to said next state of said first base sequential element being timed according to a global clock; and means for transitioning said second base sequential element to a next state after the occurrence of a transition on said second circuit clock, transition to said next State of said second base sequential element being timed according to said global clock.

9. A method of implementing a circuit logic in a field programmable device (FPD), said circuit logic containing a first base sequential element to be clocked by a first circuit clock and a second base sequential element to be clocked by a second circuit clock, said method comprising:

transitioning said first base sequential element to a next state only after the occurrence of a transition on said first circuit clock, transition to said next state of said first base sequential element being timed according to a global clock; and transitioning said second base sequential element to a next state only after the occurrence of a transition on said second circuit clock, transition to said next state of said second base sequential element being timed according to said global clock.

* * * * *